US008026201B2

(12) United States Patent
Zhang et al.

(10) Patent No.: US 8,026,201 B2
(45) Date of Patent: Sep. 27, 2011

(54) STRIPPER FOR COATING LAYER

(75) Inventors: Ruzhi Zhang, Pennington, NJ (US); Ping-Hung Lu, Bridgewater, NJ (US)

(73) Assignee: AZ Electronic Materials USA Corp., Somerville, NJ (US)

( * ) Notice: Subject to any disclaimer, the term of this patent is extended or adjusted under 35 U.S.C. 154(b) by 727 days.

(21) Appl. No.: 11/619,208

(22) Filed: Jan. 3, 2007

(65) Prior Publication Data

US 2008/0161217 A1    Jul. 3, 2008

(51) Int. Cl.
*C11D 7/32* (2006.01)
*C11D 7/28* (2006.01)
*C11D 7/50* (2006.01)

(52) U.S. Cl. ........ 510/176; 510/254; 510/257; 510/264; 510/499; 510/500; 510/501; 510/504; 510/505; 510/506; 134/1.3

(58) Field of Classification Search ............ 510/175, 510/245, 254, 257, 264, 499, 500, 501, 504, 510/505, 506, 176
See application file for complete search history.

(56) References Cited

U.S. PATENT DOCUMENTS

| 5,529,887 | A | 6/1996 | Horn et al. | |
|---|---|---|---|---|
| 6,465,403 | B1 | 10/2002 | Skee | |
| 6,916,772 | B2 * | 7/2005 | Zhou et al. | 510/201 |
| 7,192,910 | B2 * | 3/2007 | Wojtczak et al. | 510/175 |
| 2004/0149309 | A1 * | 8/2004 | Hsu | 134/3 |
| 2004/0152608 | A1 * | 8/2004 | Hsu | 510/175 |
| 2005/0202987 | A1 | 9/2005 | Small et al. | |
| 2005/0250660 | A1 | 11/2005 | Takashima | |
| 2006/0014656 | A1 | 1/2006 | Egbe et al. | |
| 2006/0063688 | A1 * | 3/2006 | Yokoi et al. | 510/176 |
| 2006/0154839 | A1 | 7/2006 | Hardi et al. | |
| 2006/0205622 | A1 * | 9/2006 | Egbe | 510/170 |
| 2006/0205623 | A1 * | 9/2006 | Oowada et al. | 510/175 |
| 2007/0060490 | A1 * | 3/2007 | Skee | 510/175 |
| 2007/0232513 | A1 * | 10/2007 | Hsu | 510/175 |

FOREIGN PATENT DOCUMENTS

| EP | 0 618 506 A1 | 3/1994 |
|---|---|---|
| EP | 662705 A2 | 12/1995 |
| EP | 662705 A3 | 12/1995 |
| EP | 1610185 A2 | 12/2005 |
| EP | 1610185 A3 | 12/2005 |
| EP | 1612858 A2 | 4/2006 |
| EP | 1612858 A3 | 4/2006 |
| JP | 2001-305752 A | 11/2001 |
| JP | 2005-74413 A | 3/2005 |
| JP | 2005-162786 A | 6/2005 |
| JP | 2005-285989 A | 10/2005 |
| WO | WO 2003/006538 A1 | 1/2003 |
| WO | WO2005043245 * | 5/2005 |

OTHER PUBLICATIONS

English language abstract of JP 2005-162786 A, (Jun. 2005).
English language abstract of JP 2005-285989 A, (Oct. 2005).
English language abstract of JP 2005-74413 A, (Mar. 2005).
Machine Language English Translation from Japanese Patent Office of JP 2001-305752, ( Nov. 2001 ).
International Search Report from corresponding PCT application of above application, (Sep. 2008).
Written Opinion of the International Searching Authority from corresponding PCT application of above application, (Sep. 2008).
Notification Concerning Transmittal of International Preliminary Report on Patentability (Chapter I of the Patent Cooperation Treaty) (Form PCT/IB/326), International Preliminary Report on Patentability (Form PCT/IB/373), and Written Opinion of the International Searching Authority (Form PCT/ISA/237) for PCT/IB2008/000040 dated Jul. 16, 2009, which corresponds to U.S. Appl. No. 11/619,208.

* cited by examiner

*Primary Examiner* — Gregory R Del Cotto
(74) *Attorney, Agent, or Firm* — Alan P. Kass; Sangya Jain

(57) ABSTRACT

The invention relates to compositions and methods of removing silicon-based anti-reflective coatings/hardmask layers.

24 Claims, No Drawings

STRIPPER FOR COATING LAYER

BACKGROUND

In the microelectronics industry, the trend is to reduce the size of structural features. Microlithography employing effective photoresists provides the enabling techniques. However, as the feature miniaturization continues, there is a need to decrease the photoresist thickness as well. For some lithographic imaging processes, the thin photoresist used in advance microlithography can no longer provide enough masking for the duration of etching in order to achieve the transfer of patterns to the substrate with high fidelity.

One solution to this problem is the utilization of a layer underlying the photoresist, which not only functions as anti-reflective coating, but also provides sufficient etch selectivity. This enhanced etch selectivity will allow this coating to be used as an image transfer intermediate. In the current state-of-the-art technology development, silicon-containing bottom anti-reflective coating is employed to serve this purpose in, for example, a trilayer scheme currently being developed by the semiconductor industry.

Despite the fact that the cured silicon-containing bottom antireflective coating/hardmask materials can be removed by dry etching employing plasma, it is very desirable that they can be removed by stripping or wet etching without damaging the substrate or IC devices. Currently, the stripper technology serves to remove organic materials. For example, U.S. Pat. Nos. 4,744,834, 4,395,479, 4,401,748, 4,428,871 disclose 2-pyrrolidone based stripping compositions useful for removing photoresists from substrates. U.S. Pat. Nos. 4,776,892 and 4,239,661 disclose aqueous stripping compositions containing an organic quaternary ammonium base. U.S. Pat. No. 3,673,099 and European Patent 0531292 are directed to stripping compositions containing a mixture of substituted 2-pyrrolidone and an organic quaternary ammonium base.

Cured silicon-oxygen containing materials behave differently from organic materials, as they are more similar to inorganic silicate structures. It has been shown that silicon-bottom antireflective coating materials can be removed by composition containing HF (Proceedings of SPIE 2005, vol. 5753, pp. 449-458). WO 2004/113417 A1 discloses silicon-containing bottom antireflective coating material with high HF etch rate. However, HF is extremely toxic and disposal of HF-containing stripper is also a problem.

The inventors have discovered that silicon-containing bottom antireflective coating materials can not be removed by stripper containing HF. Therefore, there is a need to develop a stripper for removal of silicon-oxygen containing bottom antireflective coating/hardmask materials

SUMMARY OF THE INVENTION

The present invention relates to a stripping composition comprising, or consisting essentially of, a fluoride source; an organic quaternary ammonium base; and a solvent selected from an organic solvent, water, and mixtures thereof. The fluoride source can be an organic fluoride salt, for example. The organic quaternary ammonium base can be an aliphatic ammonium base, for example. The fluoride source and organic quaternary ammonium base can be present in a ratio (weight/weight) of fluoride source:organic quaternary ammonium base of from about 10:1 to about 0.1:1, further from about 7:1 to about 0.5:1, and further from about 5:1 to about 0.75:1. A method for stripping a coating layer from a substrate is also presented.

DETAILED DESCRIPTION OF THE INVENTION

The present invention relates to a stripping composition comprising, or consisting essentially of, a fluoride source; an organic quaternary ammonium base; and a solvent selected from an organic solvent, water, and mixtures thereof. The fluoride source can be an organic fluoride salt, for example. The organic quaternary ammonium base can be an aliphatic ammonium base, for example. The fluoride source and organic quaternary ammonium base can be present in a ratio (weight/weight) of fluoride source:organic quaternary ammonium base of from about 10:1 to about 0.1:1, further from about 7:1 to about 0.5:1, and further from about 5:1 to about 0.75:1. A method for stripping a coating layer from a substrate is also presented.

One component of the composition is a fluoride source. Examples of fluoride sources include organic based fluoride sources such as quaternary ammonium salts (e.g., a tetra$C_{1-6}$ alkylammonium fluoride such as tetramethylammonium fluoride, tetraethylammonium fluoride, tetrapropylammonium fluoride, and tetrabutylammonium fluoride, a tri$C_{1-6}$ alkyl$C_{6-20}$ alkylammonium fluoride such as trimethyllaurylammonium fluoride, trimethyllaurylammonium fluoride, and cetyltrimethylammonium fluoride, and a di$C_{1-6}$ alkyl di$C_{8-20}$ alkylammonium fluoride such as dimethyldilaurylammonium fluoride and diethyldilaurylammonium fluoride), aliphatic/aryl quaternary ammonium salts (e.g., benzyl-tri$C_{1-16}$ alkyl ammonium fluoride), and their hydrates. Further examples of these salts include dimethyldiethtylammonium fluoride, benzyltrimethylammonium fluoride, benzyltributylammonium fluoride, cetyltrimethylammonium fluoride, isopropyltrimethylammonium fluoride, sec-butyltrimethylammonium fluoride, pentyltriethylammonium fluoride, methyltrioctylammonium fluoride, as well as the mixtures and hydrates thereof.

Other examples of suitable fluoride sources are diquaternary ammonium difluoride salts such as compounds having the formula $[(R')_3N^+(Z)_mN^+(R')_3](F^-)_2$, wherein each R' is individually alkyl of from 1 to 20 carbon atoms, heteroalkyl of from 1 to 20 carbon atoms, aryl, heteroaryl, cycloalkyl of from 3 to 6 carbon atoms, cycloheteroalkyl of from 3 to 6 carbon atoms, or combinations thereof; N is the quadricoordinate element nitrogen, or the heteroatom nitrogen in an alicyclic, heteroalicyclic or heteroaromatic structure; Z is a bridging member selected from the group consisting of alkyl of from 1 to 20 carbon atoms, alkenyl of from 2 to 20 carbon atoms, aryl, heteroalkyl of from 1 to 20 carbon atoms, heteroalkenyl of from 2 to 20 carbon atoms and heteroaryl; and m is 1 to 10. Examples of these compounds include $[(CH_3)_3N^+(CH_2)_6N^+(CH_3)_3](F^-)_2$, $[(C_3H_7)_3N^+(CH_2)_6N^+(C_3H_7)_3](F^-)_2$, $[(CH_3)_3N^+(C_2H_4)_6N^+(CH_3)_3](F^-)_2$, $[(C_6H_5)_3N^+(CH_2)_6N^+(CH_3)_3](F^-)_2$, $[(C_6H_5)_3N^+(C_2H_4)_2N^+(CH_3)_3](F^-)_2$, and the like, etc. Another example of a diquaternary ammonium fluoride salt is N,N'-difluoro-2,2'-bipyridinium (bistetrafluoroborate) (known as MEC-31). Yet another example is tetrakis(dimethylamino)ethene (TDAE)/CF3 complex.

Other examples of fluoride sources include tetraalkylammonium difluorotriaryl(or trialkyl or mixtures of aryl and alkyl)disilicate which have the formula $[aryl]_q[alkyl]_rSi[F]_s$ where q is 1 or 2, r is 1 or 2, and s is 2 or 3.

One example is a compound having the formula

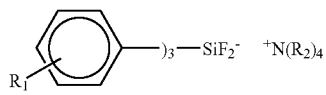

where $R_1$ is zero to three substituents, each of which are independently alkyl, alkenyl, aryl alkanoyl, alkoxy, or nitro; and $R_2$ is an alkyl group, an example being tetrabutylammonium difluorotriphenylsilicate.

Other examples are compounds having the formulae

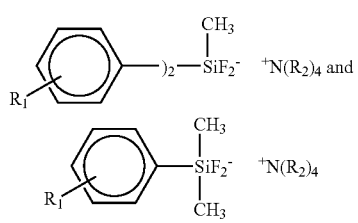

where $R_1$ and $R_2$ are defined above.

These types of salts are more fully described in U.S. Pat. Nos. 6,414,173 and 6,203,721, both of which are incorporated herein by reference.

Additional diquaternary ammonium fluoride salts are also diquaternary ammonium fluoride salts of DABCO (1,4-diazabicyclo[2.2.2]octane), shown by the formula

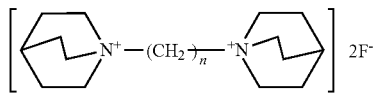

where n is 1 to 10. These salts are more fully described in U.S. Pat. No. 4,559,213, which is incorporated herein by reference.

Other fluoride sources include pyridinium salts such as benzyl-3-hydroxypyridinium fluoride, imidazolidine salts such as 1,3-didecyl-2-methylimidazolium fluoride, tetrazolium salts such as 2,3,5-triphenyl-tetrazolium fluoride, and the like, etc. Yet other fluoride sources include fluorinated organic compounds that can release fluoride by an elimination reaction under heat.

Other fluoride sources include materials such as 1-fluoro-4-chloromethyl-1,4-diazoniabicyclo[2.2.2]octane bis(tetrafluoroborate) (tradename Selectfluor), 1-fluoro-4-hydroxy-1,4-diazoniabicyclo[2.2.2]octane bis(tetrafluoroborate) (tradename Accufluor), N,N'-difluoro-2,2'-bipyridinium bis (tetrafluoroborate), the 'N—F' reagents (e.g., $R_2N$—F), the '[N—F]$^+$' reagents (e.g., $R_3N^+$—F), 2,2-difluoro-1,3-dimethylimidazolidine, diethylaminosulfur trifluoride, $R_aR_bN$—$CF_2$—$R_c$, where $R_a$ is hydrogen or alkyl and $R_b$ and $R_c$ are each selected from alkyl or aryl (tradename Fluorinox), perfluorobutanesulfonyl fluoride, and the like, etc. Other fluoride sources include alkali metal salts (e.g., LiF, NaF, KF, etc) and alkaline earth metal salts (e.g., $CaF_2$, $MgF_2$, etc).

Other fluoride sources include ammonium fluoride ($NH_4F$), alkyl hydrogen fluoride ($NRH_3F$), dialkylammonium hydrogen fluoride ($NR_2H_2F$), trialkylammonium hydrogen fluoride ($NR_3HF$), trialkylammonium trihydrogen fluoride ($NR_3(3HF)$), where R is alkyl or aryl.

Hydrates and mixtures of the foregoing are also contemplated in the present invention.

Another component in the inventive composition is an organic quaternary ammonium base. Examples include aliphatic, aryl, and mixed aliphatic/aryl quaternary ammonium hydroxide and mixtures thereof, where the aliphatic and aryl groups are unsubstituted or substituted. Further examples include, but are not limited to, tetramethyl ammonium hydroxide, tetraethyl ammonium hydroxide, tetrapropyl ammonium hydroxide, tetraisopropyl ammonium hydroxide, tetrabutyl ammonium hydroxide, trimethylethylammonium hydroxide, (2-hydroxyethyl)trimethylammonium hydroxide, (2-hydroxyethyl)triethylammonium hydroxide, (2-hydroxyethyl)tripropylammonium hydroxide, (1-hydroxypropyl)trimethylammonium hydroxide, ethyltrimethylammonium hydroxide, diethyldimethylammonium hydroxide, dimethyldiethylammonium hydroxide, trimethyl (2-hydroxyethyl) ammonium hydroxide, trimethyl-3-hydroxypropyl ammonium hydroxide, trimethyl-3-hydroxybutyl ammonium hydroxide, trimethyl-4-hydroxybutyl ammonium hydroxide, triethyl-2-hydroxyethyl ammonium hydroxide, tripropyl-2-hydroxyethyl ammonium hydroxide, tributyl-2-hydroxyethyl ammonium hydroxide, dimethylethyl-2-hydroxyethyl ammonium hydroxide, dimethyldi(2-hydroxyethyl) ammonium hydroxide, monomethyltri(2-hydroxyethyl)ammonium hydroxide, tetraisobutyl ammonium hydroxide, tetra-tert-butyl ammonium hydroxide, monomethyl-triethyl ammonium hydroxide, monomethyltripropyl ammonium hydroxide, monomethyltributyl ammonium hydroxide, monoethyltrimethyl ammonium hydroxide, monoethyltributyl ammonium hydroxide, dimethyldibutyl ammonium hydroxide, triethyl (2-hydroxyethyl)ammonium hydroxide, benzyltrimethylammonium hydroxide, decyl trimethyl ammonium hydroxide, and tetraphenyl ammonium hydroxide.

Another component in the inventive composition is a solvent. Suitable solvents may include for example ketones such as acetone, methyl ethyl ketone, methyl isobutyl ketone, cyclohexanone, isophorone, methyl isoamyl ketone, 2-heptanone 4-hydroxy, and 4-methyl 2-pentanone; $C_1$ to $C_{10}$ aliphatic alcohols such as methanol, ethanol, n-propanol, isopropanol, n-butanol, sec-butanol, and the like; aromatic group containing-alcohols such as benzyl alcohol; phenol, cyclic carbonates such as ethylene carbonate and propylene carbonate; aliphatic or aromatic hydrocarbons (for example, hexane, toluene, xylene, etc and the like); cyclic ethers, such as dioxane and tetrahydrofuran; ethylene glycol; propylene glycol; hexylene glycol; ether alcohols, for example, 1-butoxyethoxy-2-propanol, 3-methyl-3-methoxybutanol, ethylene glycol n-butyl ether, ethylene glycol phenyl ether, ethylene glycol monomethylether, ethylene glycol monoethylether, ethylene glycol propyl ether, diethylene glycol hexyl ether, diethylene glycol monoethyl ether, diethylene glycol monomethyl ether, diethylene glycol monobutyl ether, diethylene glycol monopropyl ether, propylene glycol ethyl ether, propylene glycol isobutyl ether, propylene glycol monomethyl ether, propylene glycol monobutyl ether, propylene glycol monoethyl ether, propylene glycol n-propyl ether, propylene glycol phenyl ether, propylene glycol-t-butyl ether, dipropylene glycol ethyl ether, dipropylene glycol monobutyl ether, dipropylene glycol monomethyl ether, dipropylene glycol monopropyl ether, triethylene glycol ethyl ether, triethylene glycol methyl ether, triethylene glycol n-butyl ether, tripropylene glycol methyl ether, tripropylene glycol n-butyl ether; ethylene glycol alkylether acetates such as methylcellosolve acetate and ethylcellosolve acetate; propylene glycol alkyletheracetates such as propylene glycol methylether acetate, propylene glycol ethylether acetate, propylene glycol propylether acetate, and propylene glycol butylether acetate; propylene glycol alkyletherpropionates such as propylene glycol methyletherpropionate, propylene glycol ethyletherpropionate, propylene glycol propyletherpropionate, and propylene glycol butyletherpropionate; 2-methoxyethyl ether (diglyme); solvents that have both ether and hydroxy moieties such as methoxy butanol, ethoxy butanol, methoxy propanol, and ethoxy propanol; esters such as methyl acetate, ethyl acetate, propyl acetate, and butyl acetate methyl-pyruvate, ethyl pyruvate; ethyl 2-hydroxy propionate, methyl 2-hydroxy 2-methyl propionate, ethyl 2-hydroxy 2-methyl propionate, methyl hydroxy acetate, ethyl hydroxy acetate, butyl hydroxy acetate, methyl lactate, ethyl lactate, propyl lactate, butyl lactate, methyl 3-hydroxy propionate, ethyl 3-hydroxy propionate, propyl 3-hydroxy propionate, butyl 3-hydroxy propionate, methyl 2-hydroxy 3-methyl butanoic acid, methyl methoxy acetate, ethyl methoxy acetate, propyl methoxy acetate, butyl methoxy acetate, methyl ethoxy acetate, ethyl ethoxy acetate, propyl ethoxy acetate, butyl ethoxy acetate, methyl propoxy acetate, ethyl propoxy acetate, propyl propoxy acetate, butyl propoxy acetate, methyl butoxy acetate, ethyl butoxy acetate, propyl butoxy acetate, butyl butoxy acetate, methyl 2-methoxy propionate, ethyl 2-methoxy propionate, propyl 2-methoxy propionate, butyl 2-methoxy propionate, methyl 2-ethoxypropionate, ethyl 2-ethoxypropionate, propyl 2-ethoxypropionate, butyl 2-ethoxypropionate, methyl 2-butoxypropionate, ethyl 2-butoxypropionate, propyl 2-butoxypropionate, butyl 2-butoxypropionate, methyl 3-methoxypropionate, ethyl 3-methoxypropionate, propyl 3-methoxypropionate, butyl 3-methoxypropionate, methyl 3-ethoxypropionate, ethyl 3-ethoxypropionate, propyl 3-ethoxypropionate, butyl 3-ethoxypropionate, methyl 3-propoxypropionate, ethyl 3-propoxypropionate, propyl 3-propoxypropionate, butyl 3-propoxypropionate, methyl 3-butoxypropionate, ethyl 3-butoxypropionate, propyl 3-butoxypropionate, and butyl 3-butoxypropionate; oxyisobutyric acid esters, for example, methyl-2-hydroxyisobutyrate, methyl α-methoxyisobutyrate, ethyl methoxyisobutyrate, methyl α-ethoxyisobutyrate, ethyl α-ethoxyisobutyrate, methyl β-methoxyisobutyrate, ethyl β-methoxyisobutyrate, methyl β-ethoxyisobutyrate, ethyl β-ethoxyisobutyrate, methyl β-isopropoxyisobutyrate, ethyl β-isopropoxyisobutyrate, isopropyl β-isopropoxyisobutyrate, butyl β-isopropoxyisobutyrate, methyl β-butoxyisobutyrate, ethyl β-butoxyisobutyrate, butyl β-butoxyisobutyrate, methyl α-hydroxyisobutyrate, ethyl α-hydroxyisobutyrate, isopropyl α-hydroxyisobutyrate, and butyl α-hydroxyisobutyrate; unsubstituted or substituted pyrrolidinones such as, for example, 2-pyrrolidinone, 1-methyl-2-pyrrolidinone, 1-ethyl-2-pyrrolidinone, 1-propyl-2-pyrrolidinone, 1-hydroxymethyl-2-pyrrolidinone, 1-hydroxyethyl-2-pyrrolidinone, 1-hydroxypropyl-2-pyrrolidinone, unsubstituted or substituted tetrahydrothiophene-1,1-dioxides such as, for example, tetrahydrothiophene-1,1-dioxide, methyl tetrahydrothiophene-1,1-dioxide and ethyl tetrahydrothiophene-1,1-dioxide and other solvents such as dimethyl sulfoxide, dibasic esters, and gamma-butyrolactone; a ketone ether derivative such as diacetone alcohol methyl ether; a ketone alcohol derivative such as acetol or diacetone alcohol; lactones such as butyrolactone; an amide derivative such as dimethylacetamide or dimethylformamide, anisole, and mixtures thereof. The solvent, or mixture of solvents, as those in the art will appreciate as being easy to determine without undue experimentation, should solubilize the fluoride source.

In addition to the above components, optional materials such as surfactants and the like can be added to the inventive composition. Examples of surfactants include those that are preferably low foaming, environmentally safe, preferably biodegradable, chemically stable, and soluble in aqueous solutions, especially where the stripper solution may be heated. Nonionic surfactants are particularly useful, although anionic and cationic surfactants may be used. For example, nonionic surfactants which are linear or branched alkoxylates, ethylene oxide/propylene oxide polymers, acetylenic alcohols, polyethylene glycol monophenyl ether, etc. Specific examples of surfactants include, but are not limited to, linear alcohol alkoxylates, tridecylalkoxylates, poly(ethylene oxide co propylene oxide) and polyethylene oxide. The stripper of the present invention may contain single or mixtures of these surfactants.

The other optional additives include antifoaming agents, anti-corrosion agents, wetting agents, and the like.

The following examples demonstrate the effectiveness of the inventive composition and method for stripping a coating layer. Examples 1 and 2 demonstrate the inventive stripping composition, the stripping procedure, and the stripping results of silicon-bottom antireflective coating on silicon wafer. Examples 4 and 5 demonstrate the inventive stripping composition, the stripping procedure, and the stripping results of silicon-bottom antireflective coating on silicon dioxide or silicon nitride substrates. Example 3 demonstrates the inventive stripping composition, the stripping procedure, and the stripping result of underlayer/silicon-bottom antireflective coating/photoresist on silicon wafer. Comparative examples 1 and 2 show the stripping procedure using buffered oxide etchant (BOE; 50:1) containing HF and the stripping results. Comparative examples 3 and 4 show the stripping procedure and results using commercial strippers containing N-methyl pyrrolidinone and/or tetramethyl ammonium hydroxide.

EXAMPLE 1

A silicon-containing bottom antireflective coating formulation, AZ@ EXP ArF—S05 (available from AZ Electronic Materials), was spin-coated on a 4" silicon wafer at 1400 rpm. The coated wafer was baked on hotplate at 225° C. for 90 seconds. The film thickness was measured to be 98.7 nm using a VASE Ellipsometer manufactured by J. A. Woollam Co. Inc.

In a 2 L glass beaker was charged 6 g of tetramethyl ammonium hydroxide (TMAH), 108 g of N-methylpyrrolidinone (NMP), 39 g of propylene glycol, 147 g of D.I. water, and 30 g of tetrabutylammonium fluoride trihydrate. The mixture was stirred to mix all the materials and then heated and maintained at a temperature of 75° C. The coated wafer was immersed into the mixture and nitrogen gas was gently bubbled into the solution. After five minutes, the wafer was taken out and rinsed with D.I. water and acetone, and dried. Visual inspection by the naked eye revealed complete removal of silicon-bottom antireflective coating. This was further confirmed by inspection under a Nikon microscope and by SEM.

EXAMPLE 2

A silicon-containing bottom antireflective coating formulation, AZ@ EXP ArF—S10 (available from AZ Electronic Materials), was spin-coated on a 4" silicon wafer at 1400 rpm. The coated wafer was baked on hotplate at 250° C. for 90 seconds. The film thickness was measured to be 127.7 nm using a VASE Ellipsometer manufactured by J. A. Woollam Co. Inc.

In a 2 L glass beaker was charged 6 g of TMAH, 108 g of NMP, 39 g of propylene glycol, 147 g of D.I. water, and 30 g of tetrabutylammonium fluoride trihydrate. The mixture was stirred to mix all the materials and then heated and maintained at a temperature of 75° C. The coated wafer was immersed into the mixture and nitrogen gas was gently bubbled into the solution. After five minutes, the wafer was taken out and rinsed with D.I. water and acetone, and dried. Visual inspection by the naked eye revealed complete removal of silicon-bottom antireflective coating. This was further confirmed by inspection under a Nikon microscope and by SEM.

EXAMPLE 3

A layer of AZ@ ArF—1C5D (available from AZ Electronic Materials) was spin-coated on an 8" silicon wafer and baked at 200° C. for 60 seconds (FT=37 nm). Then, a silicon-containing bottom antireflective coating formulation, AZ@ EXP ArF—$SO_5$ (available from AZ Electronic Materials), was spin-coated over the underlayer at 1270 rpm. The coated wafer was baked on hotplate at 225° C. for 90 seconds to achieve a silicon-bottom antireflective coating thickness of 110 nm. Then, a layer of AZ® AX2120 photoresist (available from AZ Electronic Materials) was spin-coated over the cured layer. After exposure and development, a patterned photoresist over silicon-bottom antireflective coating/underlayer on top of a silicon wafer was obtained. The wafer was cleaved and a piece with patterns was picked for stripping study.

In a 1 L glass beaker was charged 72 g of NMP, 96 g of propylene glycol, 17 g of TMAH, and 15 g of tetrabutylammonium fluoride trihydrate. The mixture was stirred to mix all the materials and then heated and maintained at a temperature of 80° C. The coated wafer piece was immersed into the mixture and nitrogen gas was gently bubbled into the solution. After ten minutes, the wafer was taken out and rinsed with D.I. water and acetone, and dried. Visual inspection by the naked eye revealed complete removal of silicon-bottom antireflective coating. This was further confirmed by inspection under a Nikon microscope and by SEM.

EXAMPLE 4

A layer of $SiO_2$ (thickness 469 nm) was deposited on a 4" silicon wafer. A silicon-containing bottom antireflective coating formulation, AZ@ EXP ArF—S14 (available from AZ Electronic Materials), was then spin-coated over the $SiO_2$ layer at 1240 rpm. The coated wafer was baked on hotplate at 240° C. for 60 seconds. The film thickness of the silicon-containing bottom antireflective coating formulation was measured to be 100 nm using a VASE Ellipsometer manufactured by J. A. Woollam Co. Inc.

In a 2 L glass beaker was charged 6 g of TMAH, 108 g of NMP, 39 g of propylene glycol, 147 g of D.I. water, and 30 g of tetrabutylammonium fluoride trihydrate. The mixture was stirred to mix all the materials and then heated and maintained at a temperature of 75° C. The coated wafer was immersed into the mixture and nitrogen gas was gently bubbled into the solution. After five minutes, the wafer was taken out and rinsed with D.I. water and dried. Visual inspection by the naked eye revealed complete removal of silicon-bottom antireflective coating and no damage to the $SiO_2$ layer. This was further confirmed by inspection under a Nikon microscope and by SEM.

EXAMPLE 5

A layer of silicon nitride (thickness 200 nm) was deposited on an 8" silicon wafer. A silicon-containing bottom antireflective coating formulation, AZ@ EXP ArF—S14 (available from AZ Electronic Materials), was then spin-coated over the silicon nitride layer at 1240 rpm. The coated wafer was baked on hotplate at 240° C. for 60 seconds. The film thickness of the silicon-containing bottom antireflective coating formulation was 100 nm.

In a 2 L glass beaker was charged 6 g of TMAH, 108 g of NMP, 39 g of propylene glycol, 147 g of D.I. water, and 30 g of tetrabutylammonium fluoride trihydrate. The mixture was stirred to mix all the materials and then heated and maintained at a temperature of 75° C. The coated wafer was immersed into the mixture and nitrogen gas was gently bubbled into the solution. After five minutes, the wafer was taken out and rinsed with D.I. water and dried. Visual inspection by the naked eye revealed complete removal of silicon-bottom antireflective coating and no damage to the silicon nitride layer. This was further confirmed by inspection under a Nikon microscope.

COMPARATIVE EXAMPLE 1

A silicon-containing bottom antireflective coating formulation AZ@ EXP ArF—$SO_5$ (available from AZ Electronic Materials) was spin-coated on a 4" silicon wafer at 1400 rpm. The coated wafer was baked on hotplate at 225° C. for 90 seconds. The film thickness was measured to be 97.1 nm using a VASE Ellipsometer manufactured by J. A. Woollam Co. Inc.

In a 1 L HDPE beaker was charged 200 mL of a buffered oxide etchant (BOE 50:1 available from J. T. Baker) containing $NH_4F$ and HF in aqueous solution. The bottom half of the coated wafer (with a flat edge) was immersed into the buffered oxide etchant, leaving the top half of the wafer above the liquid surface. After one minute, the wafer was taken out and rinsed with D.I. water and acetone, and dried. Visual inspection of the bottom half wafer by the naked eye did not indicate the removal of silicon-bottom antireflective coating. This was further confirmed by inspection under a Nikon microscope and by SEM.

COMPARATIVE EXAMPLE 2

A silicon-containing bottom antireflective coating formulation AZ@ EXP ArF—S10 (available from AZ Electronic Materials) was spin-coated on a 4" silicon wafer at 1400 rpm. The coated wafer was baked on hotplate at 250° C. for 90 seconds. The film thickness was measured to be 122.1 nm using a VASE Ellipsometer manufactured by J. A. Woollam Co. Inc.

In a 1 L HDPE beaker was charged 200 mL of a buffered oxide etchant (BOE 50:1 available from J. T. Baker) containing $NH_4F$ and HF in aqueous solution. The bottom half of the coated wafer (with a flat edge) was immersed into the commercial remover formulation, leaving the top half of the wafer above the liquid surface. After one minute, the wafer was taken out and rinsed with D.I. water and acetone, and dried. Visual inspection of the bottom half wafer by naked eyes revealed complete removal of silicon-bottom antireflective coating. However, residuals were observed and confirmed by inspection under a Nikon microscope and by SEM.

COMPARATIVE EXAMPLE 3

A silicon-containing bottom antireflective coating formulation AZ@ EXP ArF—S10 (available from AZ Electronic Materials) was spin-coated on a silicon wafer at 1400 rpm. The coated wafer was baked on hotplate at 250° C. for 90 seconds. The film thickness was measured to be 130.2 nm using a VASE Ellipsometer manufactured by J. A. Woollam Co. Inc.

In a 2 L glass beaker was charged 300 g of AZ@ 400T Photoresist Stripper (available from AZ Electronic Materials), which was heated and maintained at 75° C. The coated wafer was immersed into the stripper solution and nitrogen gas was gently bubbled into the solution. After twenty minutes, the wafer was taken out and rinsed with D.I. water and acetone, and dried. Visual inspection by naked eyes indicated only partial removal of silicon-bottom antireflective coating. This was further confirmed by inspection under a Nikon microscope and by SEM.

COMPARATIVE EXAMPLE 4

A silicon-containing bottom antireflective coating formulation AZ@ EXP ArF—S10 (available from AZ Electronic Materials) was spin-coated on a silicon wafer at 1400 rpm. The coated wafer was baked on hotplate at 250° C. for 90 seconds. The film thickness was measured to be 116.3 nm using a VASE Ellipsometer manufactured by J. A. Woollam Co. Inc.

In a 2 L glass beaker was charged 200 mL of AZ@ 400T Photoresist Stripper (available from AZ Electronic Materials) and 200 mL of AZ@ 300 MIF Developer (available from AZ Electronic Materials), which was mixed together, heated and maintained at 75° C. The coated wafer was immersed into the stripper solution and nitrogen gas was gently bubbled into the solution. After five minutes, the wafer was taken out and rinsed with D.I. water and acetone, and dried. Visual inspection by naked eyes indicated only partial removal of silicon-bottom antireflective coating. This was further confirmed by inspection under a Nikon microscope and by SEM.

The stripping compositions of this invention can be used as stripping agents for silicon-based antireflective coatings/hardmask layers by contacting the antireflective coatings/hardmask layers on a substrate with the stripping composition in a variety of means, such as by immersion in a stripping bath or by spraying the stripping composition onto the silicon-based antireflective coatings/hardmask layers. Typically the stripping time can range from about 1-60 minutes, preferably 1-30 minutes and more preferably 1-15 minutes, and the stripping temperature can range from about 20° C. to about 150° C., preferably 20° C. to 100° C. The exact processing details are determined by the equipment, materials to be removed and processing environment.

While the use of the above compositions for stripping antireflective coatings/hardmask layers from substrates has alone been illustrated, it will be appreciated that the stripping compositions of the invention are suitable for other uses which will be apparent to those skilled in the art, such as, for example, in the stripping of photoresist coatings, carbon-based antireflective coatings, carbon-based hardmask materials, polymer residues from reaction or curing vessels and the like, or for stripping coatings, such as for example, paints and varnishes and the like, from surfaces.

While the invention has been explained in relation to its preferred embodiments, it is to be understood that various modifications thereof will become apparent to those skilled in the art upon reading the specification. Therefore, it is to be understood that the invention disclosed herein is intended to cover such modifications as fall within the scope of the appended claims.

What is claimed is:

1. A stripping composition comprising: an organic fluoride salt; an organic quaternary ammonium base; and an organic solvent, further wherein the stripping composition is free of water and is capable of removing silicon containing coating, and further where the fluoride salt is selected from the group consisting of diquaternary ammonium difluoride salts, compounds having the formulae

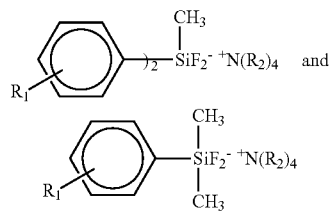

where $R_1$ is zero to three substituents, each of which are independently alkyl, alkenyl, aryl alkanoyl, alkoxy, or nitro; and $R_2$ is an alkyl group diquaternary ammonium fluoride salts of 1,4-diazabicyclo[2.2.2]octane, 1-fluoro-4-chloromethyl-1,4-diazoniabicyclo[2.2.2] octane bis(tetrafluoroborate), 1-fluoro-4-hydroxy-1,4-diazoniabicyclo [2.2.2]octane bis(tetrafluoroborate), N,N'-difluoro-2,2'-bipyridinium bis(tetrafluoroborate), 'N—F' reagents, '[N—F]+' reagents, 2,2-difluoro-1,3-dimethylimidazolidine, diethylaminosulfur trifluoride, $R_aR_bN—CF_2—R_c$, where $R_a$ is hydrogen or alkyl and $R_b$ and $R_c$ are each selected from alkyl or aryl, and perfluorobutanesulfonyl fluoride, the hydrates thereof, as well as mixtures thereof.

2. The composition of claim 1 wherein the fluoride salt is selected from compounds having the formulae

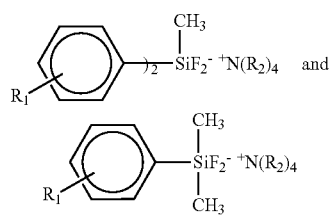

where $R_1$ is zero to three substituents, each of which are independently alkyl, alkenyl, aryl alkanoyl, alkoxy, or nitro; and $R_2$ is an alkyl group, diquaternary ammonium fluoride salts of 1,4-diazabicyclo[2.2.2]octane, 1-fluoro-4-chloromethyl-1,4-diazoniabicyclo[2.2.2] octane bis(tetrafluoroborate), 1-fluoro-4-hydroxy-1,4-diazoniabicyclo [2.2.2] octane bis(tetrafluoroborate), 2,2-difluoro-1,3-dimethylimidazolidine, diethylaminosulfur trifluoride, $R_aR_bN—CF_2—R_c$, where $R_a$ is hydrogen or alkyl and $R_b$ and $R_c$ are each selected from alkyl or aryl, and perfluorobutanesulfonyl fluoride, the hydrates thereof, as well as mixtures thereof.

3. The composition of claim 1 wherein the fluoride salt is selected from the group consisting of compounds having the formulae

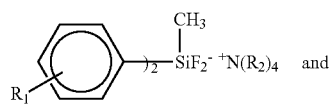

-continued

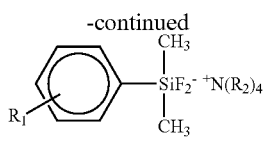

where $R_1$ is zero to three substituents, each of which are independently alkyl, alkenyl, aryl alkanoyl, alkoxy, or nitro; and $R_2$ is an alkyl group.

4. The composition of claim 1 wherein the fluoride salt is selected from the group consisting of 1-fluoro-4-chloromethyl-1,4-diazoniabicyclo[2.2.2] octane bis(tetrafluoroborate), 1-fluoro-4-hydroxy-1,4-diazoniabicyclo [2.2.2] octane bis(tetrafluoroborate), N,N'-difluoro-2,2'-bipyridinium bis (tetrafluoroborate).

5. The composition of claim 1 wherein the organic quaternary ammonium base is an unsubstituted or substituted aliphatic ammonium hydroxide, an unsubstituted or substituted aryl ammonium hydroxide, or mixtures thereof.

6. The composition of claim 1 wherein the organic quaternary ammonium base is an unsubstituted or substituted tetraalkylammonium hydroxide.

7. The composition of claim 1 wherein the organic quaternary ammonium base is selected from the group consisting of tetramethyl ammonium hydroxide, tetraethyl ammonium hydroxide, tetrapropyl ammonium hydroxide, tetraisopropyl ammonium hydroxide, tetrabutyl ammonium hydroxide, trimethylethylammonium hydroxide, (2-hydroxyethyl)trimethylammonium hydroxide, (2-hydroxyethyl)triethylammonium hydroxide, (2-hydroxyethyl)tripropylammonium hydroxide, (1-hydroxypropyl)trimethylammonium hydroxide, ethyltrimethylammonium hydroxide, diethyldimethylammonium hydroxide, dimethyldiethylammonium hydroxide, trimethyl (2-hydroxyethyl) ammonium hydroxide, trimethyl-3-hydroxypropyl ammonium hydroxide, trimethyl-3-hydroxybutyl ammonium hydroxide, trimethyl-4-hydroxybutyl ammonium hydroxide, triethyl-2-hydroxyethyl ammonium hydroxide, tripropyl-2-hydroxyethyl ammonium hydroxide, tributyl-2-hydroxyethyl ammonium hydroxide, dimethylethyl-2-hydroxyethyl ammonium hydroxide, dimethyldi(2-hydroxyethyl) ammonium hydroxide, monomethyltri(2-hydroxyethyl) ammonium hydroxide, tetraisobutyl ammonium hydroxide, tetra-tert-butyl ammonium hydroxide, monomethyl-triethyl ammonium hydroxide, monomethyltripropyl ammonium hydroxide, monomethyltributyl ammonium hydroxide, monoethyltrimethyl ammonium hydroxide, monoethyltributyl ammonium hydroxide, dimethyldibutyl ammonium hydroxide, triethyl (2-hydroxyethyl) ammonium hydroxide, benzyltrimethylammonium hydroxide, decyl trimethyl ammonium hydroxide, and mixtures thereof.

8. The composition of claim 1 wherein the organic quaternary ammonium base is tetramethylammonium hydroxide.

9. The composition of claim 1 wherein the organic solvent is a single organic solvent or a mixture of organic solvents.

10. The composition of claim 1 wherein the organic solvent is selected from the group consisting of ketones, $C_1$ to $C_{10}$ aliphatic alcohols, aromatic group containing-alcohols, cyclic carbonates, aliphatic or aromatic hydrocarbons, cyclic ethers, ethylene glycol, propylene glycol, hexylene glycol, ether alcohols, ethylene glycol alkylether acetates, 2-methoxyethyl ether, methoxy butanol, ethoxy butanol, methoxy propanol, and ethoxy propanol, esters, unsubstituted or substituted pyrrolidinones, unsubstituted or substituted tetrahydrothiophene-1,1-dioxides, dimethyl sulfoxide, dibasic esters, and gamma-butyrolactone, ketone ether derivatives, ketone alcohol derivatives, lactones dimethylacetamide, dimethylformamide, anisole, and mixtures thereof.

11. The composition of claim 1 wherein the organic solvent is selected from the group consisting of 1-methyl-2-pyrrolidinone, propylene glycol, and mixtures thereof.

12. The composition of claim 1 wherein the fluoride salt and the organic quaternary ammonium base are present in a weight ratio of fluoride source:organic quaternary ammonium base of from about 10:1 to about 0.1:1.

13. The composition of claim 1 wherein the fluoride salt and the organic quaternary ammonium base are present in a weight ratio of fluoride source:organic quaternary ammonium base of from about 7:1 to about 0.5:1.

14. The composition of claim 1 wherein the fluoride salt and the organic quaternary ammonium base are present in a weight ratio of fluoride source:organic quaternary ammonium base of from about 5:1 to about 0.75:1.

15. A stripping composition comprising; a) an organic fluoride salt selected from the group consisting of diquaternary ammonium difluoride salts, compounds having the formulae

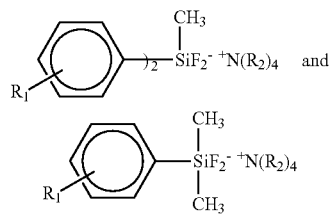

where $R_1$ is zero to three substituents, each of which are independently alkyl, alkenyl, aryl alkanoyl, alkoxy, or nitro; and $R_2$ is an alkyl group, diquaternary ammonium fluoride salts of 1,4-diazabicyclo[2.2.2]octane, 1-fluoro-4-chloromethyl-1,4-diazoniabicylo[2.2.2] octane bis(tetrafluoroborate), 1-fluoro-4-hydroxy-1,4-diazoniabicyclo [2.2.2] octane bis(tetrafluoroborate), N,N'-difluoro-2,2'-bipyridinium bis (tetrafluoroborate), 2,2-difluoro-1,3-dimethylimidazolidine, diethylaminosulfur trifluoride, $R_aR_bN$—$CF_2$—$R_c$, where $R_a$ is hydrogen or alkyl and $R_b$ and $R_c$ are each selected from alkyl or aryl, and perfluorobutanesulfonyl fluoride, the hydrates thereof, as well as mixtures thereof, b) an organic quaternary ammonium base; and,
c) a organic solvent selected from the group consisting of propylene glycol, unsubstituted or substituted pyrrolidinones, and mixtures thereof;
further where the stripping composition is free of water and is capable of removing silicon containing coating.

16. The composition of claim 15, wherein the organic quaternary ammonium base is selected from the group consisting of tetramethyl ammonium hydroxide, tetraethyl ammonium hydroxide, tetrapropyl ammonium hydroxide, tetraisopropyl ammonium hydroxide, tetrabutyl ammonium hydroxide, trimethylethylammonium hydroxide, (2-hydroxyethyl)trimethylammonium hydroxide, (2-hydroxyethyl)triethylammonium hydroxide, (2-hydroxyethyl)tripropyl ammonium hydroxide, (1-hydroxypropyl)trimethylammonium hydroxide, ethyltrimethylammonium hydroxide, diethyldimethylammonium hydroxide, dimethyldiethylammonium hydroxide, trimethyl (2-hydroxyethyl) ammonium hydroxide, trimethyl-3-hydroxypropyl ammonium hydroxide, trimethyl-3-hydroxybutyl ammonium hydroxide, trimethyl-4-hydroxybutyl ammonium hydroxide, triethyl-2-hydroxyethyl ammonium hydroxide, tripropyl-2- hydroxyethyl ammonium hydroxide, tributyl-2-hydroxyethyl ammonium hydroxide, dimethylethyl-2-hydroxyethyl ammonium hydroxide, dimethyldi(2-hydroxyethyl) ammonium hydroxide, monomethyltri(2-hydroxyethyl) ammonium hydroxide, tetraisobutyl ammonium hydroxide, tetra-tert-butyl ammonium hydroxide, monomethyl-triethyl ammonium hydroxide, monomethyltripropyl ammonium hydroxide, monomethyltributyl ammonium hydroxide, monoethyltrimethyl ammonium hydroxide, monoethyltributyl ammonium hydroxide, dimethyldibutyl ammonium hydroxide, triethyl (2-hydroxyethyl) ammonium hydroxide, benzyltrimethyl ammonium hydroxide, and decyl trimethyl ammonium hydroxide, and mixtures thereof.

17. The composition of claim 15, wherein the organic solvent is a mixture of propylene glycol and 1-methyl-2-pyrrolidinone.

18. The composition of claim 15 wherein the fluoride source and the organic quaternary ammonium base are present in a weight ratio of fluoride source:organic quaternary ammonium base of from about 10:1 to about 0.1:1.

19. The composition of claim 15 wherein the fluoride source and the organic quaternary ammonium base are present in a weight ratio of fluoride source:organic quaternary ammonium base of from about 7:1 to about 0.5:1.

20. The composition of claim 15 wherein the fluoride source and the organic quaternary ammonium base are present in a weight ratio of fluoride source:organic quaternary ammonium base of from about 5:1 to about 0.75:1.

21. A method for stripping a coating from a substrate comprising contacting the coating with the composition of claim 1.

22. The method of claim 21, wherein said coating is a silicon-containing bottom antireflective coating.

23. A method for stripping a coating from a substrate comprising contacting the coating with the composition of claim 15.

24. The method of claim 23, wherein said coating is a silicon-containing bottom antireflective coating.

* * * * *